United States Patent
Van Den Brink

(10) Patent No.: US 7,310,548 B2
(45) Date of Patent: Dec. 18, 2007

(54) METHOD OF MAGNETIC RESONANCE PERFUSION IMAGING

(75) Inventor: Johan Samuel Van Den Brink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 158 days.

(21) Appl. No.: 10/551,068

(22) PCT Filed: Mar. 23, 2004

(86) PCT No.: PCT/IB2004/050322

§ 371 (c)(1),
(2), (4) Date: Sep. 27, 2005

(87) PCT Pub. No.: WO2004/088345

PCT Pub. Date: Oct. 14, 2004

(65) Prior Publication Data

US 2006/0241375 A1    Oct. 26, 2006

(30) Foreign Application Priority Data

Mar. 31, 2003   (EP) .................................. 03100848

(51) Int. Cl.
*A61B 5/05*   (2006.01)
(52) U.S. Cl. ................. 600/410; 600/363; 600/419
(58) Field of Classification Search ................ 600/363, 600/419, 468

See application file for complete search history.

(56) References Cited

U.S. PATENT DOCUMENTS

| 5,539,310 | A * | 7/1996 | Basser et al. ............... 324/307 |
| 6,452,390 | B1 * | 9/2002 | Wollin ........................ 324/306 |
| 7,020,578 | B2 * | 3/2006 | Sorensen et al. ........... 702/181 |
| 7,078,897 | B2 * | 7/2006 | Yablonskiy et al. ........ 324/307 |
| 2001/0039377 | A1 * | 11/2001 | Maier et al. ................ 600/410 |
| 2004/0106864 | A1 * | 6/2004 | Rose et al. ................. 600/410 |
| 2006/0098876 | A1 * | 5/2006 | Buscema .................... 382/195 |

OTHER PUBLICATIONS

Basser, P.J., et al.; Estimation of the Effective Self-Diffusion Tensor from the NMR Spin Echo; 1994; J. of MR; B:103:247-254.
Callot, V., et al.; An IVIM based MRI method to study microcirculation in the heart; 2003; Proc. of SPIE; 5031:214-220.
Frank, L.R.; Anisotropy in High Angular Resolution Diffusion-Weighted MRI; 2001; MR in Med.; 45:935-939.
Gray, L., et al.; Overview of Diffusion Imaging; 1998; Magnetic Resonance Imaging Clin N Am; 6:(1)125-137.
Henkelman, R.M.; Does IVIM Measure Classical Perfusion?; 1990; MRM; 16:470-475.

(Continued)

*Primary Examiner*—Brian Casler
*Assistant Examiner*—Jonathan G Cwern

(57) ABSTRACT

The present invention relates to a method of perfusion imaging comprising: performing a first magnetic resonance data acquisition (A) at a first sensitivity (b) value, performing a set of at least six second magnetic resonance data acquisitions ($B_1$, $B_2$, . . . $B_6$) with gradiant encodings in different directions at second sensitivity (b) values, determining a perfusion tensor based on the magnetic resonance data acquisitions, performing a perfusion tensor visualitation step.

20 Claims, 3 Drawing Sheets

OTHER PUBLICATIONS

Le Bihan, D., et al.; MR Imaging of Intravoxel Incoherent Motions: Application to Diffusion and Perfusion in Neurologic Disorders; 1986; Radiology; 161:401-407.

Le Bihan, D., et al.; Intravoxel Incoherent Motion Imaging Using Spin Echoes; 1991; MR in Med.; 19:221-227.

Le Bihan, D., et al.; Diffusion Tensor Imaging: Concepts and Applications; 2001; J. of MRI; 13:534-546.

Le Bihan, D.; Diffusion & Perfusion in MRI;1996; in Encyclopedia of Nuclear Magnetic Resonance; Grant-Harris; vol. 3; Con-F; pp. 1645-1656.

Le Bihan, D., et al.; The Capillary Network: A link between IVIM and classical perfusion; 1992; MRM; 27:171-178.

Le Bihan, D., et al.; Separation of Diffusion and Perfusion in Intravoxel Incoherent Motion MR Imaging; 1988; Radiology; 168:497-505.

Moore, R.J., et al.; In Vivo Intravoxel Incoherent Motion Measurements in the Human Placenta Using Echo-Planar Imaging at 0.5T; 2000; MRM; 43:295-302.

Murtz, P., et al.; Abdomen: Diffusion-weighted MR Imaging with Pulse-triggered Single-shot Sequences; 2002: Radiology; 224:258-264.

Vlaadringerbroek, M.T., et al.; 1999; Magnetic Resonance Imaging; Springer-Vertag, Berlin; Section 7.7; pp. 354-360.

* cited by examiner

METHOD OF MAGNETIC RESONANCE PERFUSION IMAGING

FIELD OF THE INVENTION

The present invention relates to the field of magnetic resonance imaging, and more particularly to perfusion tensor imaging.

BACKGROUND AND PRIOR ART

Diffusion weighted magnetic resonance imaging is a known prior art technique. In diffusion weighted magnetic resonance imaging the diffusion tensor is obtained from, the magnetic resonance measurement signal for a defined body region of interest. The diffusion tensor is then visualised by known imaging methods (U.S. Pat. No. 5,539,310; La Bilhan et al, Diffusion Tensor Imaging: Concepts and Applications, Journal of Medical Resonance Imaging 13:534-46 (2001); Lawrence R. Frank, Anisotropy in High Angular Resolution Diffusion-Weighted MRI, Magnetic Resonance in Medicine 45:935-939 (2001),). An overview of known diffusion-weighted magnetic resonance techniques is provided by Gray L. MacFall J. Overview of diffusion Imaging. Magnetic Resonance Imaging Clin N Am 1998; 6:125-138.

In addition in vivo intravoxel incoherent motion (IVIM) magnetic resonance imaging is a known technique (La Bilhan D et al, MR imaging of intravoxel inchoherent motions: application to diffusion and perfusion in neurological disorders. Radiology 1986:161:401-407.) In particular, the interpretation of IVIM measurements with respect to classical perfusion has been discussed in the prior art (La Bilhan D et al., Separation of diffusion and perfusion in intravoxel incoherent motion MR Imaging. Radiology 1998: 168:497-505; Henkelman R M. Does IVIM measure classical perfusion? Magn Reson Med 1990:16:470-475; Le Bilhan D, Turner R. The capillary network: a link between IVIM and classical perfusion. Magn Reson Med Med 1992: 27:171-178). This imaging technique uses gradient encodings for random motion.

Classical perfusion is a measure of the blood delivered to and used by a specified mass of tissue. It is often measured using spin labelling techniques in MRI. In contrast, IVIM measures quasi-random blood movement within a single imaging voxel and results in a bi-exponential signal attenuation in a standard pulsed gradient spin echo (PGSE) experiment (cf. R. J. Moore et al, in vivo intravoxel incoherent motion measurements in the human placenta using echoplanar imaging at 0.5 T, Magnetic Resonance in Medicine, 43;295-302 (2000)).

It is a common disadvantage of prior measurement techniques that only a scalar value for the perfusion is obtained even though perfusion usually is anisotropic. A scalar perfusion value therefore only gives a limited amount of information on the actual nature of the perfusion.

Therefore the present invention aims to provide an improved imaging method which enables imaging and visualisation of the perfusion anisotropy as well as a corresponding computer program product and perfusion imaging apparatus.

SUMMARY OF THE INVENTION

The present invention provides for a method of perfusion imaging which can be used for medical purposes such as abdominal imaging.

The present invention is based on the discovery that an isotropic perfusion can be described by a tensor which is structurally equivalent to a diffusion tensor used for diffusion tensor imaging (DTI). In order to provide the data for determination of a perfusion tensor a magnetic resonance data acquisition is performed at a low b sensitivity value, preferably b=0, as well as at least six magnetic resonance data acquisitions with gradient encodings in different directions at b sensitivity values of for example below 50 [s/mm$^2$], preferably between 5 and 15.

In accordance with a preferred embodiment of the invention six slopes are determined from the 7 measurement points. The slope values form the basis for calculating the perfusion tensor, especially its eigenvectors. This is based on the discovery, that for lower b sensitivity values the signal decay is mostly due to perfusion and not diffusion effects. This is why diffusion can be neglected at low b sensitivity values in order to extract the information out of the decay signal which forms the basis for determining the shape of the perfusion tensor. At least, the sorting of the eigenvalues and the direction of the eigenvectors of the perfusion tensor does not depend much on the diffusion-related signal decay. This directional information derived from the perfusion tensor can be visualized. For this purpose software algorithms which are used in the prior art for diffusion visualization can be reused due to the same mathematics governing the visualization of diffusion and perfusion tensors.

In accordance with a further preferred embodiment of the invention, two additional magnetic resonance data acquisitions are performed for higher b sensitivity values. For example one additional magnetic resonance data acquisition is performed for an intermediate b sensitivity value of around 200 and a further magnetic resonance data acquisition is performed at a high b sensitivity value of around 800.

For such high b sensitivity values the decay signal is mostly governed by its diffusion signal component, see e.g. [Petra Mürtz, et al. Abdomen: Diffusion-weighted MR Imaging with Pulse-triggered Single-Shot Sequences, 258-264, Radiology July 2002]. Especially in the abdomen, the diffusion is isotropic, as demonstrated in the cited reference. Thus, the diffusion coefficient can be obtained from just two higher b-values measurements. For brain imaging it is preferred to perform at least six data acquisitions with gradient encodings for random motion in different directions as diffusion is anisotropic in this case.

Mathematical analysis also provides the blood fraction value. This fraction is known to be isotropic for each measured signal, thus constraining the analysis. Based on the diffusion coefficient and the blood fraction value the diffusion component of the decay signal can be estimated. By subtracting the diffusion signal component from the measurement signal the perfusion signal component is obtained. The perfusion coefficient is obtained from the perfusion signal component by determining the signal slope of the perfusion signal component, thereto the b=0 and low b-value measurements are analyzed.

In accordance with a further preferred embodiment of the invention only one additional magnetic resonance data acquisition is performed for a high b sensitivity value, leaving out the intermediary measurement. In this case one of the magnetic resonance data acquisitions which have been performed for the low b sensitivity values having the highest signal value is selected as a replacement for the intermediate measurement.

It is to be noted that for the intermediate and high b data acquisitions no gradient encodings in different directions are necessary as diffusion is isotropic for such high b values.

It is a particular advantage of the present invention that due to the limited number of data acquisitions, all of the required data acquisitions can be performed for a couple of slices through the body (typically 5-10) within a single breath hold, for example in less than 16 seconds.

BRIEF DESCRIPTION OF THE DRAWINGS

In the following preferred embodiments of the invention will be described in greater detail by making reference to the drawings in which.

DETAILED DESCRIPTION

The general idea of intra-voxel incoherent motion imaging (IVIM) is that the observed MR signal decay has a bi-exponential behaviour as function of the diffusion weighting factor b, i.e.

$$S/S_0 = A1*\exp(-b*P) + A2*\exp(-b*D), \quad (1)$$

where P is the perfusion constant (in mm$^2$/sec, typically 0.05-0.08), and D the diffusion constant (in mm$^2$/sec, typically 0.002).

It can readily be appreciated that (for b=0) A1+A2=1. Thus, recognizing that the signal related to perfusion can be attributed to (randomly) flowing material in the voxel, A1 has been designated to represent f, the fraction of flowing material (i.e. blood) in the voxel. Hence f denotes the blood fraction and A2=1-f, which in other words means that the non-flowing part of the signal contributes to the diffusion signal. The fraction f, being representative of the blood content, is an isotropic quantity for each voxel. This knowledge is used to constrain the data analysis in the rest of this section.

This leads to $$S/S_0 = f*\exp(-bP) + (1-f)*\exp(-bD). \quad (2)$$

The first term of equation 2 will be referred to as the perfusion signal component and the second term in equation 2 will be referred to as the diffusion signal component. The perfusion signal component is decaying much more rapidly than the diffusion signal component and thus primarily determines the slope of the signal for low b values.

The perfusion is described by a perfusion tensor, which has the same structure as the diffusion tensor, i.e. the perfusion tensor is of second rank and symmetric.

The perfusion tensor can be determined on the basis of the bi-exponential signal of equation 2, using the signal decays for low b values whereby the diffusion signal component is neglected. This is illustrated by means of FIG. 1.

Figure 1:
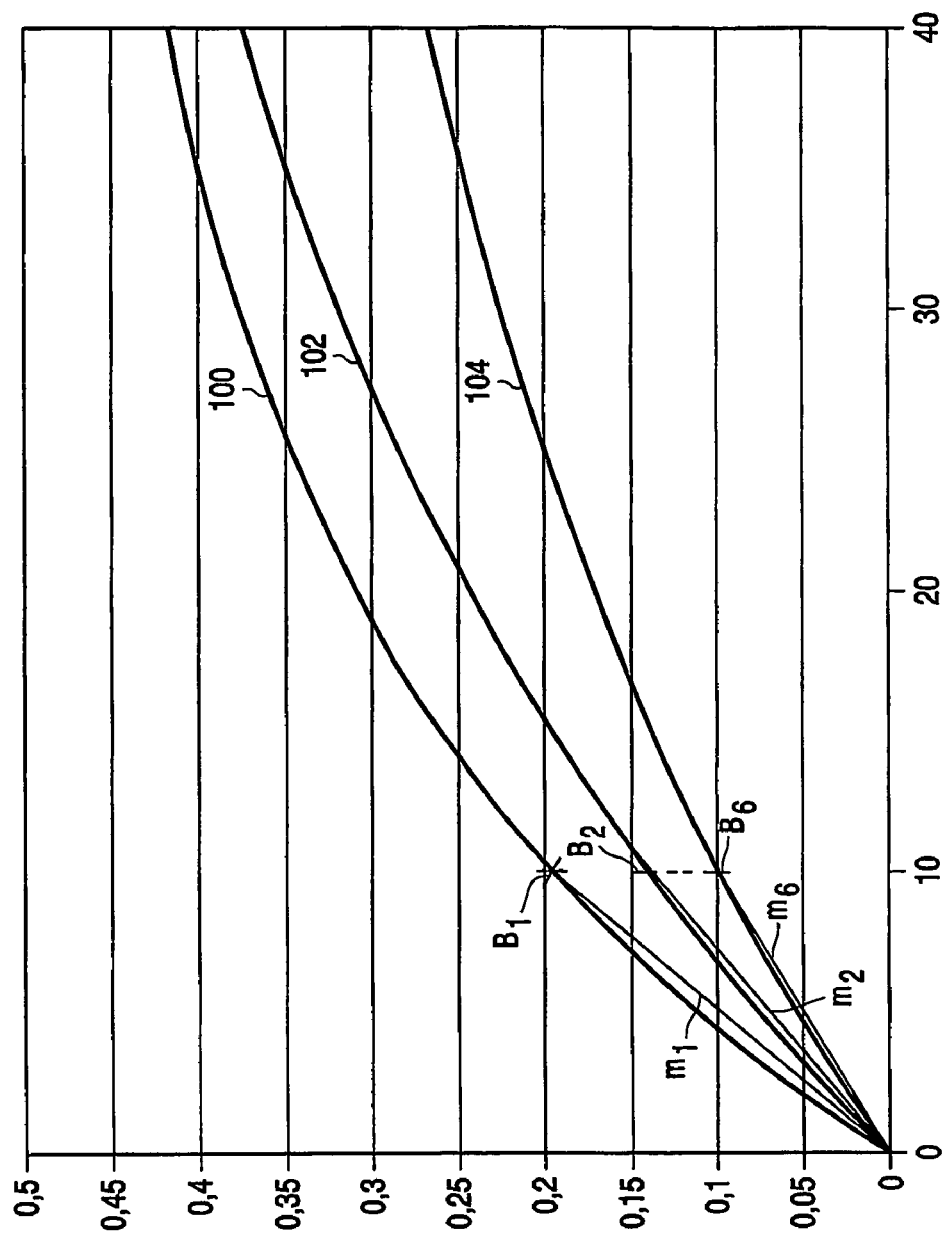
FIG. 1 is illustrative of a logarithmic diagram showing magnetic resonance imaging signals which form the basis for perfusion tensor determination and imaging.

FIG. 1 shows signal decay curves 100, 102 and 104 as a function of b. Magnetic resonance image acquisition is performed for b=0 (point A) as well as for lower b-values (points $B_1, B_2, \ldots B_6$). A good choice for the low b-value is around 10.

As it can be seen from the signal decay curves of FIG. 1 the curves are approximately linear for low b values.

For the purpose of determining the perfusion tensor the magnetic resonance data acquisition for point A is performed without gradient encoding and for the points $B_1, B_2, \ldots B_6$ at six different gradient directions, respectively. The slopes $m_1, m_2, \ldots m_6$ of the signal decay curves for low b-values are determined as illustrated in FIG. 1 by linear approximation.

By means of the six slope values the perfusion tensor can be calculated by means of the same mathematics as used for diffusion tensor calculation (c.f. for example M. T. Vlaadringerbroek and J. A. den Boer. Magnetic Resonance Imaging. Springer-Verlag Berlin Heidelberg New York, 1999, in particular section 7.7).

Figure 2:
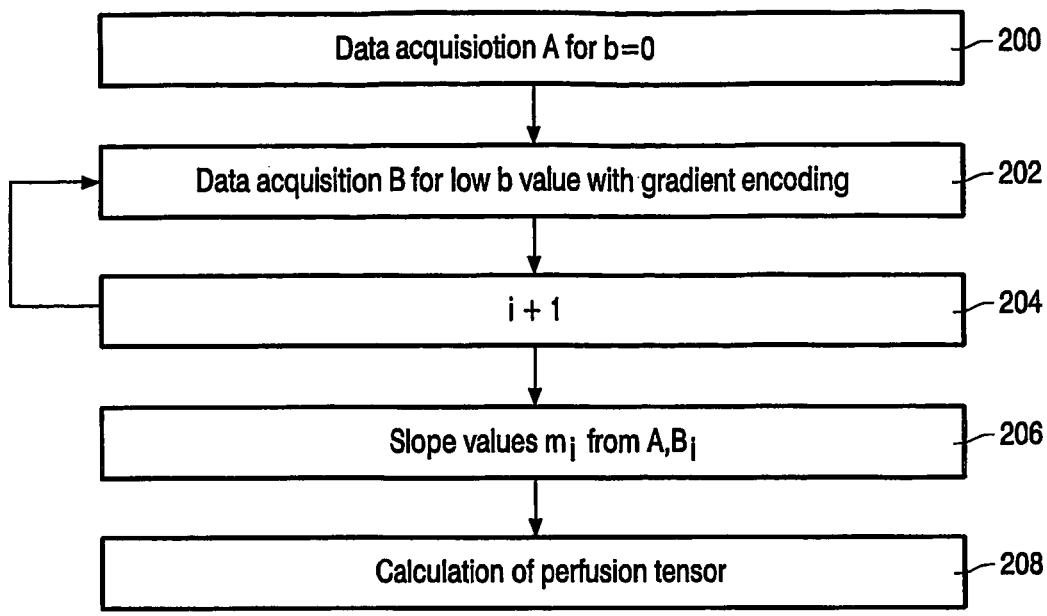
FIG. 2 is illustrative of a flow chart for determining the perfusion tensor based on the signals shown in FIG. 1.

FIG. 2 is illustrative of the corresponding flow chart. In step 200 a magnetic resonance data acquisition is performed for point A (c.f. FIG. 1) with b=0 without gradient encoding. In step 202 magnetic resonance data acquisition is performed for $B_i$ for a low b value with gradient encoding into a first direction. In step 204 the i is incremented and step 202 is performed again for the next gradient encoding direction. Step 202 is repeated at least 6 times for magnetic resonance data acquisitions into at least six different gradient encoding directions.

In step 206 the slope values $m_i$ are obtained from the measurements points A and $B_i, B_2, \ldots B_6$ by linear approximation, i.e. from the slopes of the straight lines connecting A to $B_1$, A to $B_2 \ldots$ A to $B_6$. These slope values provide full mapping of the perfusion tensor and are input into the perfusion tensor calculation routine of step 208.

For increased precision the diffusion signal component of equation (2) is also taken into consideration for the perfusion tensor determination. One way of accomplishing this is illustrated by making reference to FIG. 3.

Figure 3:
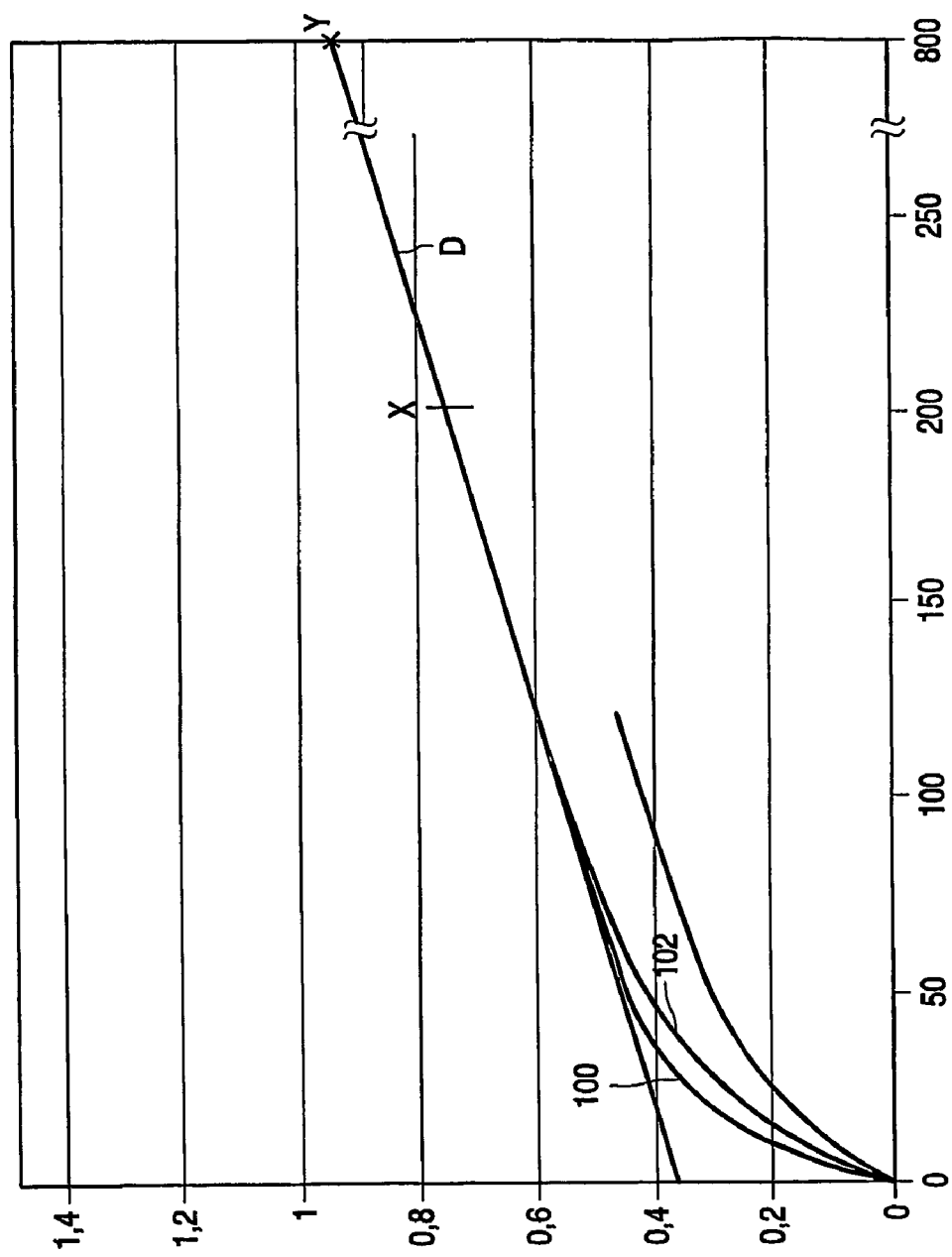
FIG. 3 is an enlarged view of the decay curves of FIG. 1 and is illustrative of a further preferred embodiment of the invention.

FIG. 3 shows the signal decay curves 100 and 102 of FIG. 1 for higher b-values. As apparent from FIG. 3 the signal decay curves become approximately a straight line for higher b values.

For determination of the diffusion coefficient D two magnetic resonance data acquisitions are performed for b values within the linear portion of the signal decay curves. For example this can be done for b=200 (point X) and for b=800 (point Y).

The slope of the straight line between points X and Y is the diffusion coefficient D. The extrapolation of the straight line between X and Y to b=0 provides 1-f as illustrated in FIG. 3. This way the diffusion signal component of equation (2) is obtained. It is to be noted that the extrapolation by means of the straight line is performed for convenience of explanation; in a practical application it is preferred to perform the analysis of the bi-exponential decay using well known mathematical routines such as available from the LAPACK mathematical library.

The perfusion signal component is analysed by subtracting the estimated diffusion signal component, i.e. $S_{est} = (1-f)*\exp(-bD)$, from the measured value S. For the b=0 value of the curve this provides a value $S_0*f$, denoted as $S_0'$. For any signal related to non-zero b-values, a value S' is derived. A new curve can now be drawn to show $\ln(S_0'/S')$. The slope of this curve provides P.

In other words, by subtracting the estimated diffusion signal component, the perfusion signal component is isolated from the measured data values; as f is also known the perfusion coefficient P can be obtained this way.

For example, this enables a pre-processing of the signal decay curves 100, 102, 104, . . . of FIG. 1 by subtracting the diffusion signal component before the determination of the slopes $m_i$.

Alternatively the perfusion coefficient P is calculated as explained above for every diffusion-sensitisation gradient direction. The resulting set of at least six perfusion coefficients is used to calculate the perfusion tensor map. Specifically, the perfusion tensor's eigenvalues, eigenvectors, and rotationally invariant quantities like the trace or the fractional anisotropy are derived and visualized. Also, voxels with substantially co-linear main eigenvectors can be connected (starting from a user defined seed position), and the connecting line can be displayed (tractography).

In order to avoid the measurement for point X at the intermediate b value it is also possible to use the highest value of the $B_1, B_2, \ldots B_6$ measurements for low b values as an approximation. In the example considered here the highest value is B (cf. FIG. 1). In order to obtain an approximation for D and 1–f, a straight line between Y and $B_1$ can be used instead of a straight line between X and Y.

One of the advantages of keeping the number of high b-value acquisitions at a minimum is that each acquisition prolongs the breath hold duration by typically 1 to 3 seconds. Completely avoiding higher b-value acquisitions enables the use of short echo times, because such high b-value acquisitions require much gradient area, thus having a relatively long echo time (typically 60-90 ms, whereas T2 relaxation in the abdomen is only 100 ms). The long echo time relative to T2 relaxation significantly lowers the SNR of the measurements. Using only small b values (<50) significantly reduces the required gradient area, and thus enables lower echo times (typically 20-30 ms). This significantly improves the SNR.

Figure 4:
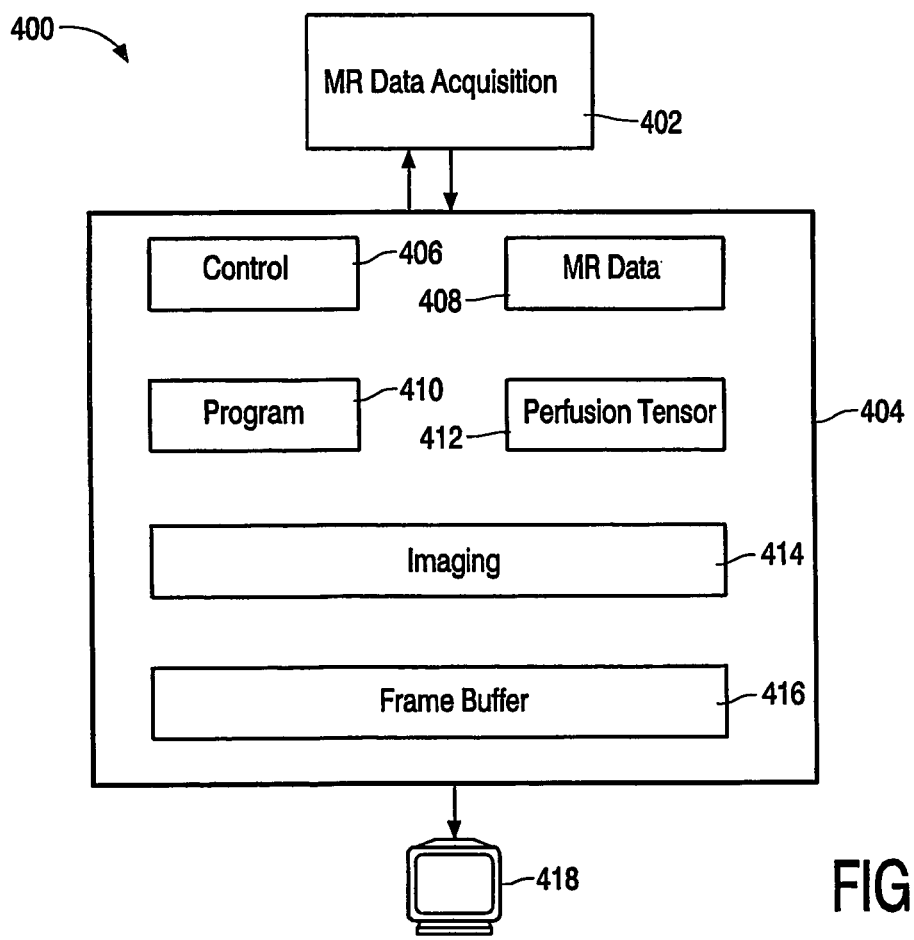
FIG. 4 is a block diagram of an imaging system.

FIG. 4 shows a block diagram of perfusion imaging system 400. Perfusion imaging system 400 has magnetic resonance data acquisition device 402 which provides magnetic resonance data to computer system 404. For example, the magnetic resonance data acquisition is performed by means of a sequence of single-shot echo-planner MR imaging sequences.

These sequences are determined by control program 406 which controls MR data acquisition device 402 accordingly. The acquired MR data is stored in storage 408. Program 410 analyses the acquired MR data which are stored in storage 408 in accordance with the principles as explained above with reference to FIGS. 1 to 3. This way a perfusion tensor is obtained which is stored in storage 412. The perfusion tensors stored in storage 412 are processed by imaging program 414 which generates a perfusion tensor image which is stored in frame buffer 416 for display on display unit 418 connected to computer system 404.

REFERENCE NUMERALS 100 signal decay curve
102 signal decay curve
104 signal decay curve
400 performance imaging system
402 MR data acquisition device
404 computer system
406 control program
408 storage
410 program
412 storage
414 imaging program
416 frame buffer
418 display unit

The invention claimed is:

1. A method of perfusion imaging comprising:
   performing a first magnetic resonance data acquisition with gradient encodings for random motion at a first low b sensitivity value;
   performing a set of at least six second magnetic resonance data acquisitions with gradient encodings for random motion in different directions at second sensitivity values larger than the first low b sensitivity value; and
   determining a perfusion tensor based on the magnetic resonance data acquisitions.

2. The method of perfusion imaging of claim 1, the second sensitivity values being below 50 s/mm$^2$.

3. The method of perfusion imaging of claim 1, wherein the first low b sensitivity value is substantially zero and the second sensitivity values being between five and thirty.

4. The method of perfusion imaging of claim 1, the magnetic resonance data acquisitions being performed by a series of single-shot echo-planar magnetic resonance data acquisitions.

5. The method of perfusion imaging of claim 1, further comprising:
   performing a perfusion tensor visualisation.

6. The method of perfusion imaging of claim 5, further comprising:
   deriving directional information from the perfusion tensor, the performing of a perfusion tensor visualization including visualizing the derived directional information.

7. The method of perfusion imaging of claim 1, further comprising:
   determining first slope values between each one of the set of magnetic resonance data acquisitions and the first magnetic resonance data acquisition; and
   determining the perfusion tensor based on the first slope values.

8. The method of perfusion imaging of claim 1, further comprising:
   performing a third magnetic resonance data acquisition at a third sensitivity value;
   performing a fourth magnetic resonance data acquisition at a fourth sensitivity value, the third sensitivity value being higher than the second sensitivity values, and the fourth sensitivity value being higher than the third sensitivity value;
   determining a diffusion coefficient and a fraction value based on the third and the fourth magnetic resonance data acquisitions to provide a diffusion signal component;
   eliminating the diffusion signal component from the magnetic resonance data acquisitions to provide a perfusion signal component; and
   determining a perfusion tensor from the perfusion signal components.

9. The method of perfusion imaging of claim 8, wherein a set of at least six third magnetic resonance data acquisitions with gradient encodings for random motion in different directions at third sensitivity values is performed, and a set of at least six fourth magnetic resonance data acquisitions with gradient encodings for random motion in different directions at fourth sensitivity values is performed, and the diffusion tensor is determined based on the third and the fourth magnetic resonance data acquisitions to provide a diffusion signal component.

10. The method of perfusion imaging of claim 8, the third sensitivity value being between 100 and 400, and the second sensitivity value being between 600 and 1200.

11. A method of perfusion imaging comprising:
performing a first magnetic resonance data acquisition with gradient encodings for random motion at a first low b sensitivity value;
performing a set of at least six second magnetic resonance data acquisitions with gradient encodings for random motion in different directions at second low b sensitivity values;
selecting one of the second magnetic resonance data acquisitions having the strongest measured signal decay;
performing a third magnetic resonance data acquisition at a third sensitivity value, the third sensitivity value being higher than the second sensitivity values;
determining a diffusion coefficient and a fraction value based on the selected second and third magnetic resonance data acquisitions to provide a diffusion signal component;
eliminating the diffusion signal component from the magnetic resonance data acquisitions to provide a perfusion signal component; and
determining a perfusion tensor from the perfusion signal components.

12. A computer program product comprising a digital storage medium storing a perfusion imaging program executable to perform a method including determining a perfusion tensor based on a first magnetic resonance data acquisition and a set of at least six second magnetic resonance data acquisitions, the first magnetic resonance data acquisition being performed at a first low b sensitivity value and the second magnetic data resonance data acquisitions being performed at a second low b sensitivity value with gradient encodings in different directions, the first low b sensitivity value being below the second low b sensitivity values, and further executable to perform perfusion tensor imaging.

13. The computer program product of claim 12, wherein the perfusion imaging program is further executable to determine first slope values for each one of the second magnetic resonance data acquisitions based on the first magnetic resonance data acquisition and to determine the perfusion tensor based on the first slope values.

14. The computer program product of claim 12, wherein the perfusion imaging program is further executable to determine a diffusion coefficient and a fraction value based on third and fourth magnetic resonance data acquisitions to provide a diffusion signal component, to eliminate the diffusion signal component from the magnetic resonance data acquisitions to provide a perfusion signal component, and to determine a perfusion tensor from the perfusion signal component.

15. The computer program product of claim 14, wherein the perfusion imaging program is further executable to process a set of at least six third magnetic resonance data acquisitions with gradient encodings for random motion in different directions at third sensitivity values, a set of at least six fourth magnetic resonance data acquisitions with gradient encodings for random motion in different directions at fourth sensitivity values, and to determine the diffusion tensor based on the third and the fourth magnetic resonance data acquisitions to provide a diffusion signal component.

16. The computer program product of claim 12, wherein the perfusion imaging program is further executable to select one of the second magnetic resonance data acquisitions having the highest data value, determining of a diffusion coefficient and a fraction value based on the selected second magnetic resonance data acquisition and a third magnetic resonance data acquisition being performed at a third sensitivity value, the third sensitivity value being above the second sensitivity values, providing a diffusion signal component based on the diffusion coefficient and the blood fraction value, eliminating of the diffusion signal component from the magnetic resonance data acquisitions to provide a perfusion signal component, and to determine of a perfusion tensor from the perfusion signal components.

17. A perfusion imaging apparatus comprising:
a magnetic resonance data acquisition device; and
a computer system programmed to cause the magnetic resonance data acquisition device to perform a first magnetic resonance data acquisition at a first low b sensitivity value and to perform a set of at least six second magnetic resonance data acquisitions with gradient encodings in different directions at second low b sensitivity values below 50 s/mm$^2$, the first sensitivity value being smaller than the second sensitivity values, and further programmed to determine a perfusion tensor based on the magnetic resonance data acquisitions.

18. The perfusion imaging apparatus as set forth in claim 17, further comprising:
a display unit cooperating with the computer system to perform perfusion tensor imaging based on the determined perfusion tensor.

19. The perfusion imaging apparatus as set forth in claim 17, wherein the first low b sensitivity value is substantially zero.

20. The perfusion imaging apparatus as set forth in claim 17, wherein the computer system is further programmed to cause the magnetic resonance data acquisition device to perform at least one additional magnetic resonance data acquisition at a higher sensitivity value than the second low b sensitivity values, and is further programmed to determine a diffusion signal component of the first and second magnetic resonance data acquisitions based on the at least one additional magnetic resonance data acquisition.

* * * * *